(12) United States Patent
Simony et al.

(10) Patent No.: US 8,659,465 B2
(45) Date of Patent: Feb. 25, 2014

(54) ANALOG TO DIGITAL RAMP CONVERTER

(75) Inventors: Laurent Simony, Grenoble (FR); Benoît Deschamps, Sassenage (FR); Alexandre Cellier, Le Versoud (FR); Frédéric Barbier, Grenoble (FR)

(73) Assignees: STMicroelectronics S.A., Montrouge (FR); STMicroelectronics (Grenoble 2) SAS, Grenoble (FR)

( * ) Notice: Subject to any disclaimer, the term of this patent is extended or adjusted under 35 U.S.C. 154(b) by 68 days.

(21) Appl. No.: 13/293,969

(22) Filed: Nov. 10, 2011

(65) Prior Publication Data

US 2012/0126094 A1 May 24, 2012

(30) Foreign Application Priority Data

Nov. 18, 2010 (EP) .................................... 10306271

(51) Int. Cl.
*H03M 1/56* (2006.01)
(52) U.S. Cl.
USPC .......................................... 341/169; 341/170
(58) Field of Classification Search
USPC .................... 341/169, 170, 164, 155
See application file for complete search history.

(56) References Cited

U.S. PATENT DOCUMENTS

| | | | |
|---|---|---|---|
| 6,545,624 B2 * | 4/2003 | Lee et al. ....................... | 341/155 |
| 7,053,806 B1 * | 5/2006 | Rao et al. ....................... | 341/120 |
| 7,612,702 B2 * | 11/2009 | Danesh ........................ | 341/170 |
| 7,907,079 B1 | 3/2011 | Galloway et al. | |
| 8,188,903 B2 * | 5/2012 | Yamaoka et al. ............. | 341/169 |
| 8,279,311 B2 * | 10/2012 | Lim .............................. | 348/294 |
| 8,441,387 B2 * | 5/2013 | Wang ........................... | 341/169 |
| 8,482,448 B2 * | 7/2013 | Burm et al. ................... | 341/169 |
| 2006/0028368 A1 | 2/2006 | Takayanagi et al. | |
| 2006/0139198 A1 | 6/2006 | Rao et al. | |
| 2008/0042888 A1 | 2/2008 | Danesh | |
| 2011/0169990 A1 | 7/2011 | Higuchi et al. | |

FOREIGN PATENT DOCUMENTS

WO    WO 2010/035402 A1    4/2010

OTHER PUBLICATIONS

European Search Report and Written Opinion dated Mar. 23, 2011from corresponding European Application No. 10306271.
Storm, G.G., et al., Continuous Time Column Parallel Readout for CMOS Image Sensor, 2007 International Image Sensor Workshop, Jun. 7, 2007-Jun. 10, 2007, pp. 58-61, XP002629613.

* cited by examiner

*Primary Examiner* — Brian Young
(74) *Attorney, Agent, or Firm* — Wolf, Greenfield & Sacks, P.C.

(57) ABSTRACT

A method of analog to digital voltage conversion including: generating a quadratic signal based on an analog time varying reference signal; generating a ramp signal based on the quadratic signal; and converting an analog input voltage to a digital output value based on a time duration determined by a comparison of the analog input voltage with the ramp signal.

27 Claims, 5 Drawing Sheets

ANALOG TO DIGITAL RAMP CONVERTER

CROSS REFERENCE TO RELATED APPLICATIONS

This application claims the priority benefit of European patent application number 10306271.7, filed on Nov. 18, 2010, entitled ANALOG TO DIGITAL RAMP CONVERTER, which is hereby incorporated by reference to the maximum extent allowable by law.

BACKGROUND OF THE INVENTION

1. Field of the Invention

The present invention relates generally to an apparatus and method for analog to digital conversion, and in a particular to analog to digital voltage conversion using a ramp converter.

2. Discussion of the Related Art

Analog to digital converters (ADCs) are used in image sensors to convert an analog voltage signal representing the light intensity sensed by a photodiode into a digital signal to be stored and processed by digital processing circuits. The resolution of the resulting digital signal is determined by the number of bits generated by the ADC.

Ramp converters are a type of ADC that use a voltage ramp to detect the level of the analog input signal. While the level of the voltage ramp increases, a counter is incremented, and when the level of the voltage ramp matches the analog input signal, the digital value of the counter at that instant provides the digital conversion of the input signal.

There is today a demand for image sensors having a high data resolution, for example having pixel values of at least 10 bits, combined with a high image resolution, for example between 5 and 20 Megapixels, and a high frame rate. However, as the number of bits increases, the size and complexity of the ADC also increases. Furthermore, the greater the number of bits of the converter, the slower its operation. Indeed, the number of bits determines the maximum count value of the counter. Thus, assuming a given clock frequency of the counter, the higher the number of bits, the longer the counter will take to reach its maximum count value. Indeed, for relatively large matrices, the frame rate at full resolution is limited.

Current ADCs do not adequately address the above demands, and/or result in the introduction of undesirable distortion in the digital signal. There is thus a need for an improved ADC that addresses these issues.

SUMMARY OF THE INVENTION

It is an aim of embodiments to at least partially address one or more needs in the prior art.

According to one embodiment, there is provided a method of analog to digital voltage conversion comprising: generating a quadratic signal based on an analog time varying reference signal; generating a ramp signal based on said quadratic signal; and converting an analog input voltage to a digital output value based on a time duration determined by a comparison of said analog input voltage with said ramp signal. For example, the time duration is equal to a time period that has elapsed when the value of said ramp signal equals a threshold determined based on said analog input voltage. In one example, the threshold equals the analog input voltage.

According to one embodiment, generating said quadratic signal comprises converting a digital time signal into an said quadratic based on said analog time varying reference signal. The analog time varying reference signal is for example a linear ramp signal.

According to another embodiment, said ramp signal comprises a linear portion of a first gradient followed by a portion equal to the sum of a linear signal of said first gradient and said quadratic signal.

According to another embodiment, the derivative of said ramp signal is continuous.

According to another embodiment, generating said ramp signal further comprises: generating a linear signal; and summing said linear and quadratic signals to generate said ramp signal.

According to another embodiment, said quadratic signal is offset by a reference time with respect to said linear signal such that said ramp signal comprises a linear portion up to said reference time.

According to another embodiment, said analog input signal is the output of an image sensor, said method further comprising, prior to converting said analog input signal: applying, during an initialization phase, a first voltage level of said ramp signal and a first reference value via respective capacitors to an input terminal of an amplifier, wherein said linear portion of said ramp signal starts at a voltage level lower than said first voltage level, and said reference time occurs when the voltage level of the ramp signal is equal to or higher than said first voltage level.

According to another embodiment, said converting step comprises starting an N-bit counter at a start of said ramp signal, and storing the N-bit value of said counter when a voltage level of said ramp signal corresponds to the level of said analog input voltage, wherein said counter increments in a linear manner, the method further comprising linearizing said digital output value by converting it into an M-bit value, wherein M is equal to at least N+1.

According to another embodiment, the method further comprises adding a random value to said M-bit value.

According to an embodiment, there is provided an analog to digital converter comprising: a ramp generator adapted to generate: a quadratic signal based on an analog time varying reference signal; and a ramp signal based on said quadratic signal; and circuitry adapted to convert an analog input voltage to a digital output value based on a time duration determined by a comparison of said analog input voltage with said ramp signal.

According to one embodiment, said ramp generator comprises a first digital to analog converter arranged to generate said quadratic signal by converting a digital time signal into said quadratic signal based on said analog time varying reference signal.

According to another embodiment, said first analog signal and said time varying reference signal are currents, and wherein said ramp generator further comprises a second digital to analog converter arranged to convert said digital time signal into said time varying reference current based on a reference current.

According to another embodiment, said ramp generator further comprises: a third analog to digital converter arranged to convert said digital timing signal into a second analog current; and at least one resistor receiving said first and second analog currents to generate said ramp signal.

According to another embodiment, said digital output value is an N-bit value, and the converter further comprises adjustment circuitry adapted to convert said N-bit digital output value into an M-bit value based on a lookup table, wherein M is equal to at least N+1.

According to one aspect of the present invention, there is provided an image sensor comprising an array of pixel cells, each column of pixels cells being coupled to the above ADC.

BRIEF DESCRIPTION OF THE DRAWINGS

The foregoing and other purposes, features, aspects and advantages of embodiments will become apparent from the following detailed description of embodiments, given by way of illustration and not limitation with reference to the accompanying drawings, in which.

The same elements have been designated with same reference numerals in the different drawings.

DETAILED DESCRIPTION

For clarity, only those steps and elements which are useful to the understanding of the embodiments have been illustrated and will be described in detail. In particular, the mechanisms by which the analog signals are acquired, especially in an image sensor, have not been explained in detail, embodiments being compatible with most methods thereof. Furthermore, the use that is made of the converted digital signals provided by the ADC has not been described in detail, embodiments being compatible with any use.

It should be noted that embodiments of an ADC are described in relation to an example in which it is implemented in an image sensor. However, the ADC may more generally be applied to any analog to digital conversion in which similar problems are likely to arise, and in particular in which the noise level varies in relation to the amplitude of the input signal, for example in audio or video applications.

Figure 1:
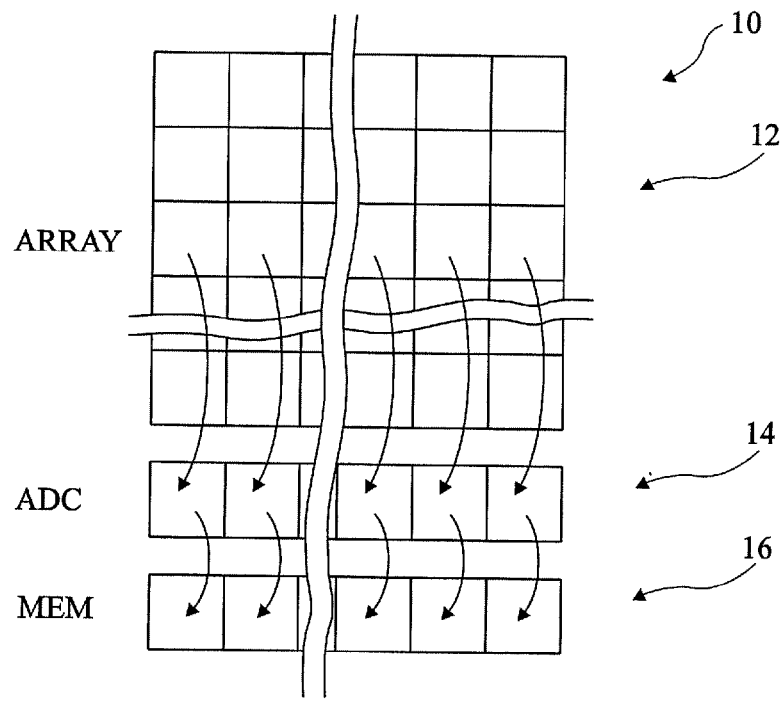
FIG. 1 schematically represents an example of an image sensor according to an embodiment.

FIG. 1 represents an image sensor 10 in which embodiments of the ADC described herein are, for example, implemented.

Sensor 10 comprises an array 12 of pixels each comprising at least one element for storing data relative to the luminance sensed by a photodiode (not shown). The array is read in one direction, such as in rows. In other words, the luminance data stored in the pixel or in any intermediary storage element is provided, for all the columns in a same row of the array, to a line of ADCs 14, which provide their respective results to be stored in storage elements 16 (MEM) for subsequent use.

Figure 2:
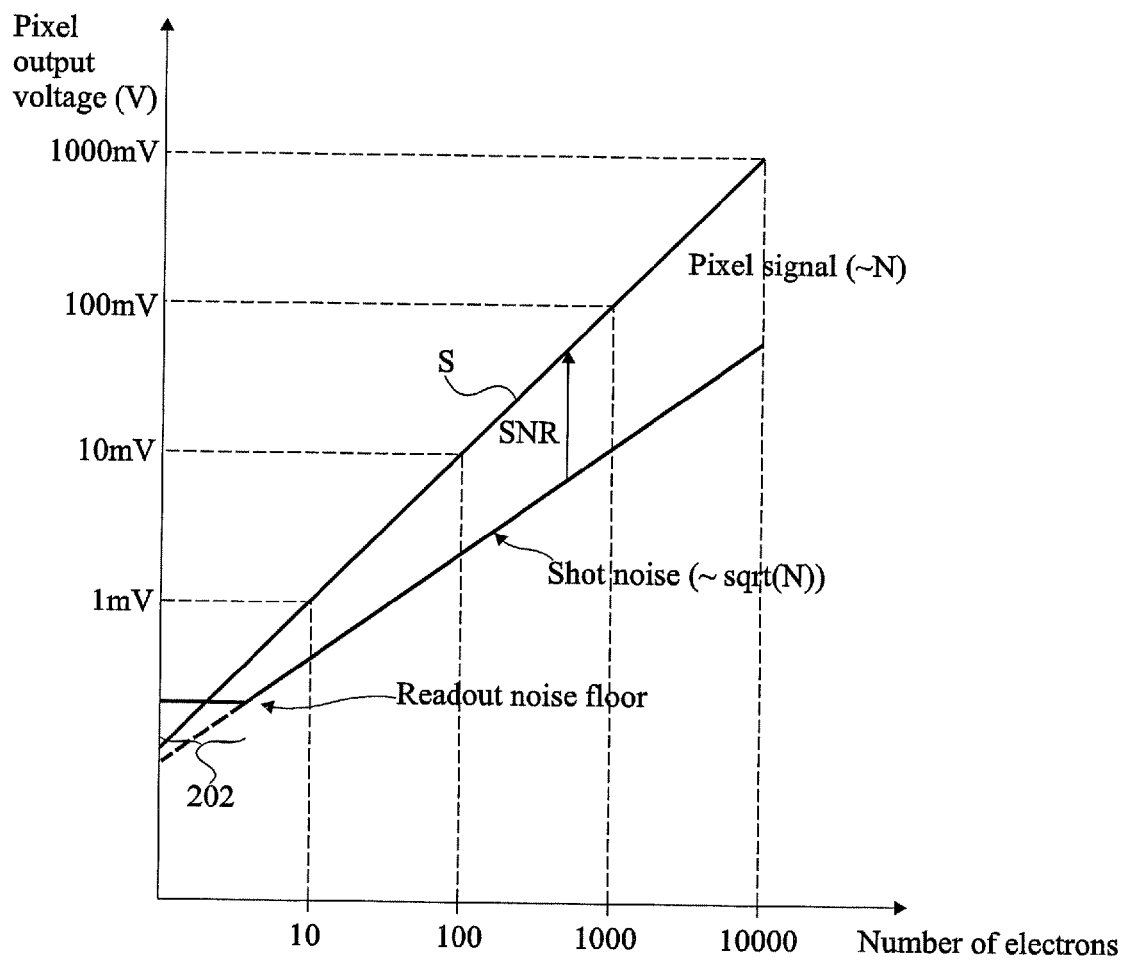
FIG. 2 is a graph representing a signal voltage amplitude against the number of electrons in a pixel of an image sensor, and the corresponding noise level.

FIG. 2 is a graph illustrating the variation in the signal voltage of a pixel according to the number of electrons sensed by the photodiode, and the corresponding noise level of a typical image sensor. The number of electrons is proportional to the light intensity received by the image sensor. FIG. 2 uses a logarithmic scale for both the x and y axes.

As illustrated in FIG. 2, the level of signal S according to the light intensity follows a substantially linear constant slope. The noise introduced into the signal comprises predominantly two types of noise: readout noise, caused by the readout transistors of the image sensor; and photonic noise, also known as shot noise, caused by statistical fluctuations in electron events. There is also quantization noise caused by analog to digital conversion, which is equal to $LSB/\sqrt{12}$, where "LSB" is the magnitude of the least significant bit. For low luminosity levels corresponding to the region labeled 202 in FIG. 2, the readout noise is the predominant noise level, and introduces a constant amplitude noise, for example in the region of 250 although this depends heavily on the image sensor. However, as the number of electrons increases, for example over around 10, the predominant noise becomes photonic noise, which is proportional to $\sqrt{N_e}$, where $N_e$ is the number of electrons collected by the pixel photodiode. Assuming a signal level that increases linearly with the number of electrons, the signal to noise ratio (SNR) thus increases from around 3 when the number of electrons is as low as 10, to around 100 when the number of electrons reaches 10000.

The resolution of the ADC is generally selected based on the desired precision for the lowest light levels. However, the present inventors have observed that the level of precision needed for very low light levels is far from optimal at high light levels, due to the increase in photonic noise. Indeed, using a high resolution output signal, the quantum, equal to the least significant bit (LSB), is small. This leads to low quantization noise equal to $LSB/\sqrt{12}$. However, given that for high signals the noise is dominated by shot noise, the high resolution is far from optimal.

Figure 3A:
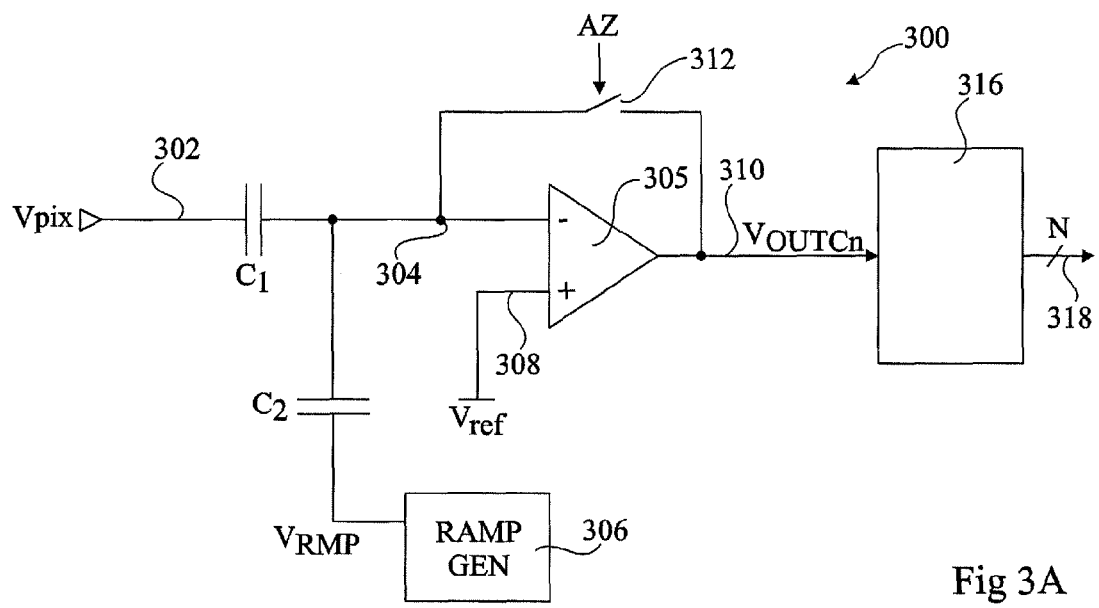
FIG. 3A schematically represents a ramp ADC according to an embodiment.

FIG. 3A schematically illustrates a ramp ADC 300 in order to demonstrate the principle behind the operation of a ramp ADC. A more detailed embodiment of such a ramp ADC is, for example, discussed in the publication titled "Continuous Time Column Parallel Readout for CMOS Image Sensor", G. G. Storm et al., which is hereby incorporated by reference to the extent permitted by the law.

An input analog voltage Vpix received on an input line 302 is for example the voltage read from a pixel cell of an image sensor via a column line (not shown). Input line 302 is coupled to the negative input terminal 304 of an amplifier 305 via a capacitor $C_1$. Input terminal 304 is also coupled, via a capacitor $C_2$, to a ramp generator 306, which generates a ramp signal $V_{RMP}$. The positive input terminal 308 of amplifier 305 is coupled to receive a reference voltage $V_{ref}$. An output line 310 of the operational amplifier 305 is coupled, via a feedback path comprising a switch 312, to the input terminal 304. Switch 312 is controlled by a control signal AZ to connect or disconnect the feedback path. The output line 310 provides a control signal $V_{OUTCn}$, used to control counter module 316. In particular, the control signal $V_{OUTCn}$ controls the time at which the output of a counter of the counter module 316 is stored into a memory unit associated with the amplifier 305. This time therefore results in the generation of an N-bit digital voltage value on an output line 318.

Figure 3B:
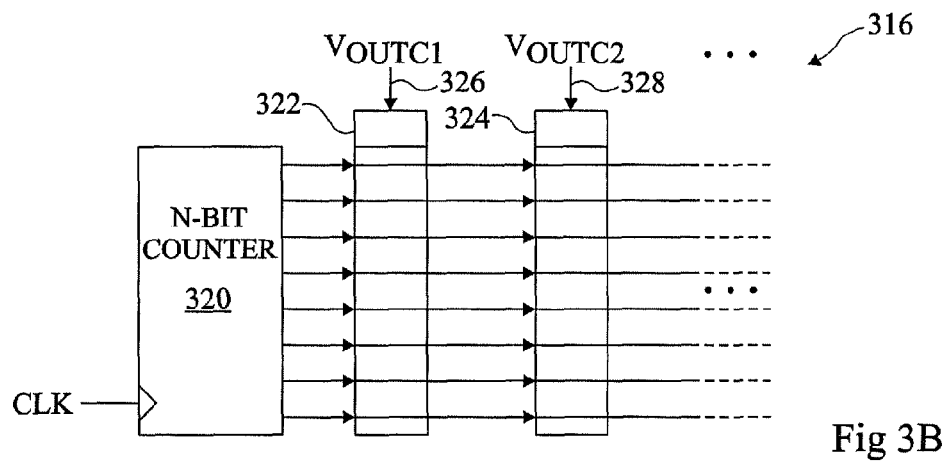
FIG. 3B illustrates memorizing circuitry for a plurality of the ADCs of FIG. 3A according to an embodiment.

FIG. 3B illustrates the counter module 316 in more detail, which receives the output of a number of ADCs 300. The counter module 316 comprises an N-bit counter 320, where N is in this example equal to 8, although in alternative embodiments it could have a different value, for example in the range 2 to 32. The counter 320 receives a clock signal CLK for incrementing the counter during the conversion phase.

The N-bit count value from counter 320 is provided to each of a series of memory units, for example implemented by SRAM, of which two are illustrated in FIG. 3B labelled 322 and 324. The number of memory units is, for example, equal to the number of columns of the image sensor array. The memory units 322, 324 comprise corresponding inputs 326, 328, for receiving respective output signals $V_{OUTC1}$, $V_{OUTC2}$ from an ADC of a corresponding column, which causes the current count value to be stored by the memory unit after a duration determined by the corresponding ADC.

Operation of the ADC 300 of FIG. 3A and of the counter module 316 will now be described with reference to the timing diagram of FIG. 4.

Figure 4:
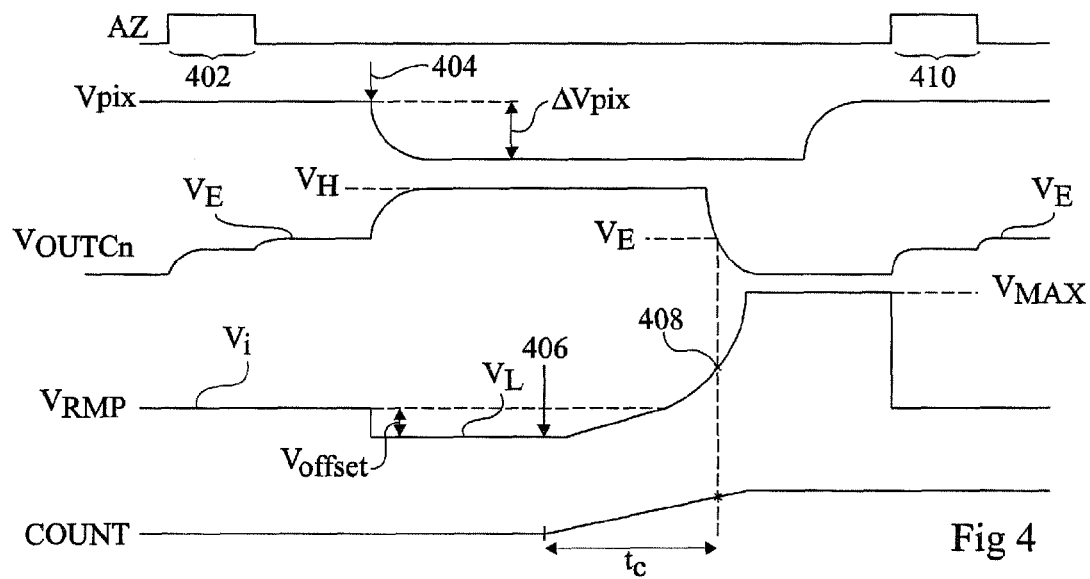
FIG. 4 is a timing diagram showing an example of signals of the converter of FIG. 3A according to an embodiment.

FIG. 4 illustrates examples of the control signal AZ of switch 312, input analog voltage $V_{pix}$, output voltage $V_{OUTCn}$, ramp signal $V_{RMP}$, and the count value COUNT at the output of N-bit counter 320 during a voltage conversion phase.

Initially, during an initialization phase, input voltage value Vpix is at an initial level, for example close to the supply voltage level $V_{DD}$, and the control signal AZ is asserted for a short period 402 to activate the feedback path and thus balance the amplifier 305. In particular, while signal AZ is asserted, the output voltage $V_{OUTCn}$ will become equal to $V_{ref}$, which is the value at the positive input terminal 308. Then, when signal AZ is brought low again, the output voltage $V_{OUTCn}$ settles at a certain equilibrium level $V_E$, for example equal to $V_{ref}$ plus a small offset value introduced by switch 312. At this stage, the ramp voltage signal $V_{RMP}$ is at an initial level $V_i$, which is equal to a low voltage level $V_L$ plus an offset voltage $V_{offset}$. This offset voltage is, for example, chosen to be between 50 to 100 mV, or between 5 and 10 percent of the maximum ramp amplitude, although other values are possible.

Then, at a time 404, the input voltage Vpix changes to a new level, in response to reading the corresponding pixel. For the sake of brevity, pixel circuits are not illustrated herein and nor will they be described in detail, the present disclosure being applicable to most types of pixel circuits. However, as is well known to those skilled in the art, in the case of a 4T pixel sensor or similar, at the end of an integration phase of an image sensor, a transfer transistor is used to transfer negative charge accumulated by a photodiode to a sense node of the pixel circuit. Then, during a subsequent or simultaneous read operation, performed row by row, the voltage at the sense node is output on a column line, for example via a source follower transistor and read transistor. Thus, in the example of FIG. 4, at time 404 the voltage $V_{pix}$ falls to a new value, this voltage drop representing the measured voltage signal $\Delta V_{pix}$ read from the corresponding pixel circuit. The falling level of the input voltage causes the output of the amplifier 305 to rise to a level $V_H$.

Also at time 404, the voltage ramp signal $V_{RMP}$ is reduced to voltage level $V_L$, for example equal to 0 V.

Next, at a time instant 406, the voltage ramp signal $V_{RMP}$ starts to increase from the value $V_L$. Whereas classically such an increase is in the form of a linear ramp with a constant gradient, in the embodiments described herein, at least part of the increase is in the form of a quadratic curve. In particular, from the point 406, the curve for example immediately increases in a quadratic fashion. Alternatively, as will be described in more detail below, the increase may be linear until at least the initial voltage level $V_i$ is reached, and then quadratic.

Also at the start of the increase of signal $V_{RMP}$ at point 406, the counter 320 of FIG. 3B starts counting.

When the voltage ramp reaches a certain level, the voltage level at the input terminal 304 of the amplifier 305 will start to fall. At a certain time, an example of which is labelled 408 in FIG. 4, the output of the amplifier will cross the equilibrium voltage $V_E$, before continuing to fall to a low value for example close to 0 V. The voltage ramp signal $V_{RMP}$ is applied to the input terminal 304 of amplifier 305 via capacitor $C_2$. If capacitors $C_1$ and $C_2$ are of equal capacitance, the amplifier will balance when signal $V_{RMP}$ is equal to its initial value $V_i$ plus the voltage signal $\Delta V_{pix}$. Alternatively, assuming that capacitor $C_1$ is X times larger than capacitor $C_2$, the amplifier will balance when signal $V_{RMP}$ is equal to $V_i + \Delta V_{pix} \cdot X$. An example of this point is labelled 408 in FIG. 4.

Because of the voltage difference $V_{offset}$ between the voltage $V_L$ at the start of the ramp and the initial value $V_i$, there is a time delay before a zero value of the input signal will be reached by the ramp signal. This is advantageous as initially the rise of the ramp signal may be subjected to some distortion due to capacitor $C_2$ of each converter 300 of FIG. 3A.

The voltage signal $V_{OUTCn}$ is used to control the corresponding memory unit of FIG. 3B to store the current value of a count signal. In particular, an example of the analog representation of the digital count signal COUNT generated by counter 320 is shown in FIG. 4, and at the time 408, when the output signal $V_{OUTCn}$ crosses the equilibrium level $V_E$, the count value that has been reached is sampled by the corresponding memory unit. At the time 408, the counter has been counting for a time duration $t_c$, and has thus reached a digital value depending on this count duration.

After point 408, the ramp voltage signal $V_{RMP}$ continues until a maximum value $V_{MAX}$, and then goes low again ready for a subsequent conversion. The counter also for example reaches its maximum count value when the ramp signal reaches $V_{MAX}$.

Once the ramp signal $V_{RMP}$ has reached its maximum value, a readout phase begins, in which the sampled count values are output. The count value may directly provide the digital output value of the converter, or may first be adjusted as explained in more detail below.

Shortly after the maximum value of the ramp signal $V_{RMP}$ is reached, the input analog voltage $V_{pix}$ is again brought high, for example to a value close to $V_{DD}$, which corresponds to the initial value of a pixel in the next row. Furthermore, the amplifier is balanced again by asserting the signal AZ during a period 410, ready for a subsequent conversion phase.

Figure 5:
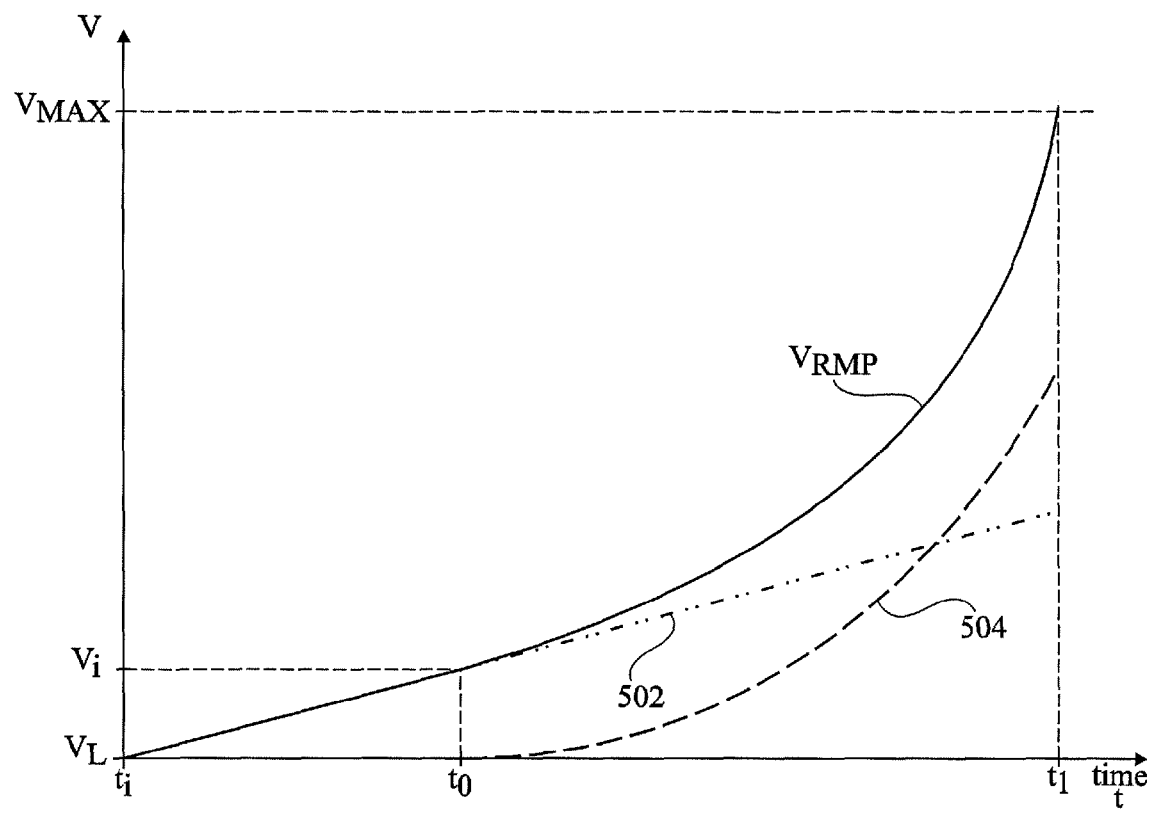
FIG. 5 is a graph showing an example of a ramp signal applied in the converter of FIG. 3A according to an embodiment.

FIG. 5 illustrates an example of the ramp portion of the ramp signal $V_{RMP}$ in more detail. The initial time $t_i$ shown in FIG. 5 corresponds to the time instant 406 of FIG. 4.

The voltage of signal $V_{RMP}$ starts at a value of $V_L$, for example 0 V, and during an initial period, until the initial voltage level $V_i$ is reached at a time $t_0$, the signal $V_{RMP}$ increases linearly. This means that at the time when the signal $V_{RMP}$ passes the initial voltage level $V_i$, the corresponding LSB, or quantum, is known. This point corresponds to a zero reading of the pixel, and thus it is advantageous to be able to determine this initial LSB, such that very low signal levels can be quantified with a deterministic LSB. The curve forming this section of the signal $V_{RMP}$ is shown by a dotted line 502, and for example has the form $y = a \cdot t$, where a is the constant gradient, and t is the time.

From time $t_0$, the signal $V_{RMP}$ becomes quadratic, and in particular becomes equal to the addition of the linear curve 502 and a quadratic curve shown by a dashed line 504. In the example of FIG. 5, the time $t_0$ corresponds exactly to the point at which the voltage level of the ramp signal $V_{RMP}$ reaches the voltage $V_i$, although alternatively it could occur some time after the voltage $V_i$ has been reached. Curve 504 is equal to zero between the initial time $t_i$ and time to, and is then for example of the form $b(t-t_0)^2$ between time $t_0$ and a time $t_1$ at the end of the ramp portion, where b is a constant. Thus the resulting curve of $V_{RMP}$ between $t_0$ and $t_1$ is of the form $y=a\cdot t+b(t-t_0)^2$.

It should be noted that between times $t_i$ and $t_1$, the derivative of the curve of the ramp signal is, for example, continuous. This is because it is formed by the addition of two continuous curves 502 and 504 having no abrupt gradient changes, and so the gradient of the combined curve changes only progressively. This is advantageous as the gradient of the ramp signal is proportional to the LSB of the output signal, and thus the LSB grows progressively, without relatively large instantaneous quantum changes.

The quadratic form of the ramp signal $V_{RMP}$, used in combination with a linearly increasing count value, results in a high sensitivity of the voltage conversion at low signal levels when the photonic noise is relatively low, and a lower sensitivity of the voltage conversion at a high light levels when the photonic noise is high. The gradient a of curve 502 and the parameter b of curve 504 are for example selected based on the clock frequency of the counter, the bit value of the counter, the maximum signal value, the time interval between $t_i$ and to, and the sensitivity of the pixels. Furthermore, the quadratic form of the curve can be chosen to best match the form of the photonic noise, for example by knowing the desired values of the ramp signal at time $t_0$ and $t_1$, as well as the desired gradient a of the curve 502.

The N-bit count value provided on output line 318 of the ADC 300 will thus have a non-linear relation between the bit-value and the light level. In some applications such a signal may be adequate without further adjustment. Alternatively, the signal may be linearized, as will now be described in relation to FIG. 6.

Figure 6:
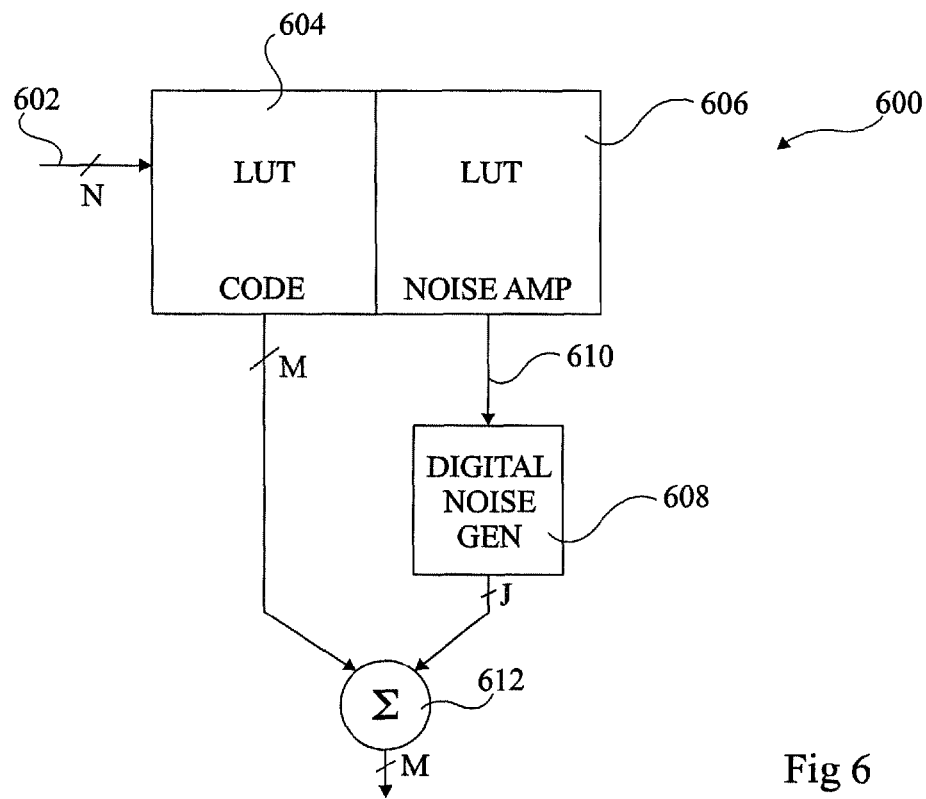
FIG. 6 illustrates digital linearizing circuitry of an ADC according to an embodiment.

FIG. 6 illustrates digital linearizing circuitry 600, which is, for example, arranged to linearize digital output values generated by the ADC 300 of FIG. 3, and comprises an N-bit input line 602 for receiving these values. It further comprises a look-up table (LUT) 604, which generates an M-bit value based on a mapping of the N-bit input value in the range 0 to $2^N$ into an M-bit output value in the range 0 to $2^M$, where M is equal to at least N+1.

However, because $2^M$ is larger than $2^N$, not all values in the range 0 to $2^M$ will be present in the output values, as there will be missing values, which in some cases could degrade the quality of the resulting image. Therefore, some random noise can be added to the signal using an LUT 606 and a pseudo-random digital noise generation block 608 in order to generate new values where there were missing values, such that all digital output values have the same probability of occurrence. In particular, the LUT 606 supplies, for each N-bit digital value, the corresponding noise magnitude and thus the number of noise bits J that are then to be generated. This information is provided on a line 610 to the digital noise generation block 608, which generates a pseudo-random value having a corresponding number J of bits, for example using one or more linear feedback shift registers. This J-bit noise value is then added, by an adder 612, to the M-bit digital value from LUT 604 to generate an M-bit output value.

Figure 7A:
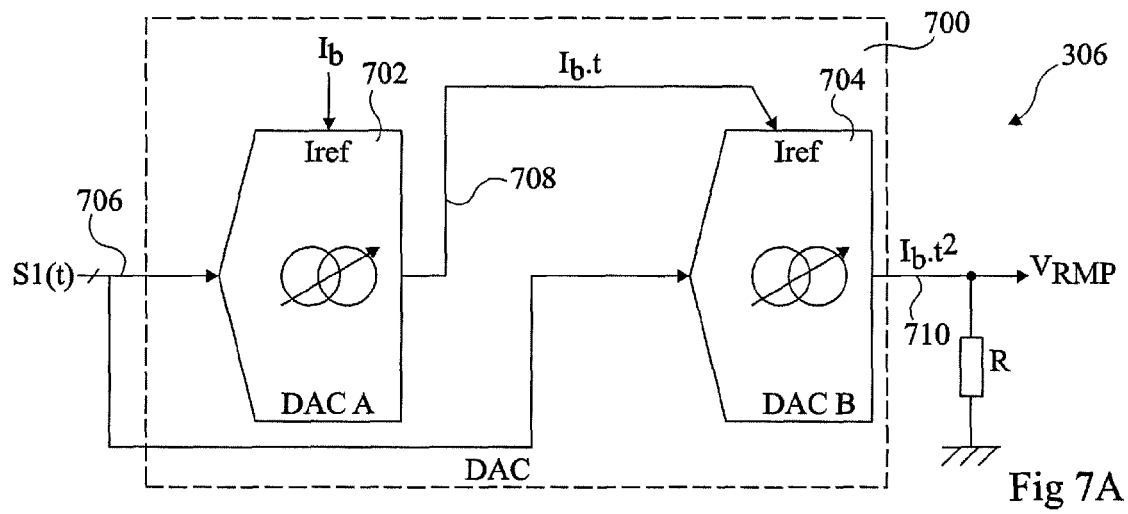
FIGS. 7A to 7C schematically illustrate alternative embodiments of ramp generators according to embodiments.
Figure 7B:
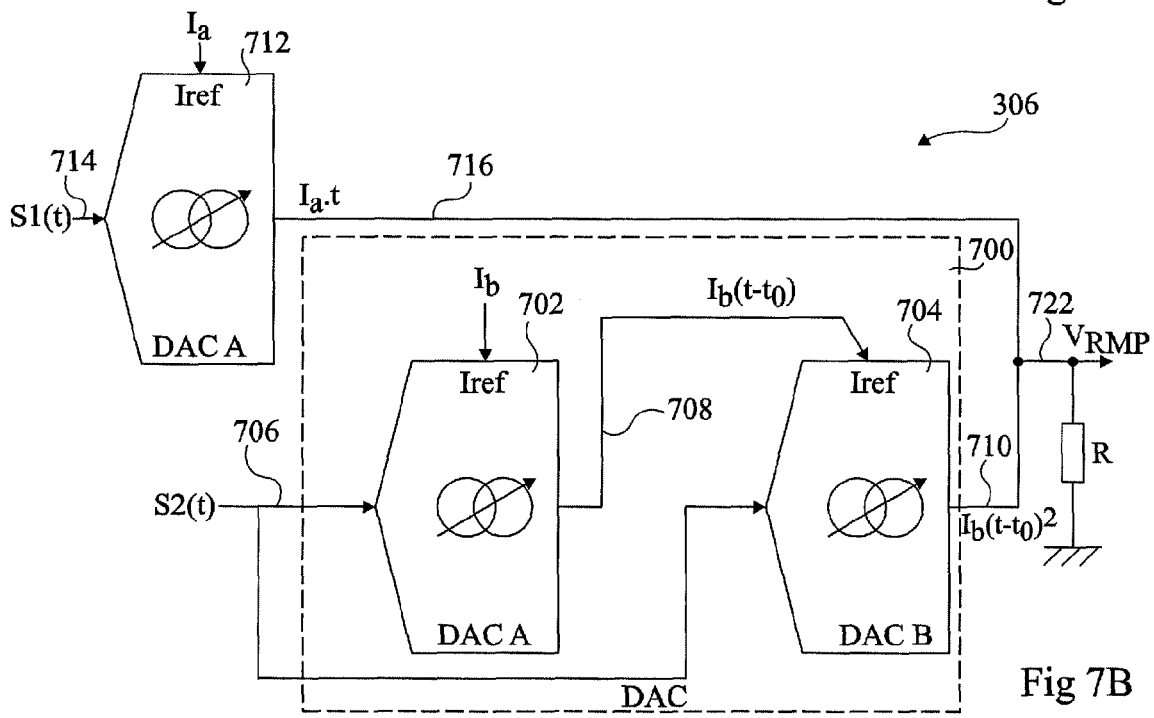
Figure 7C:
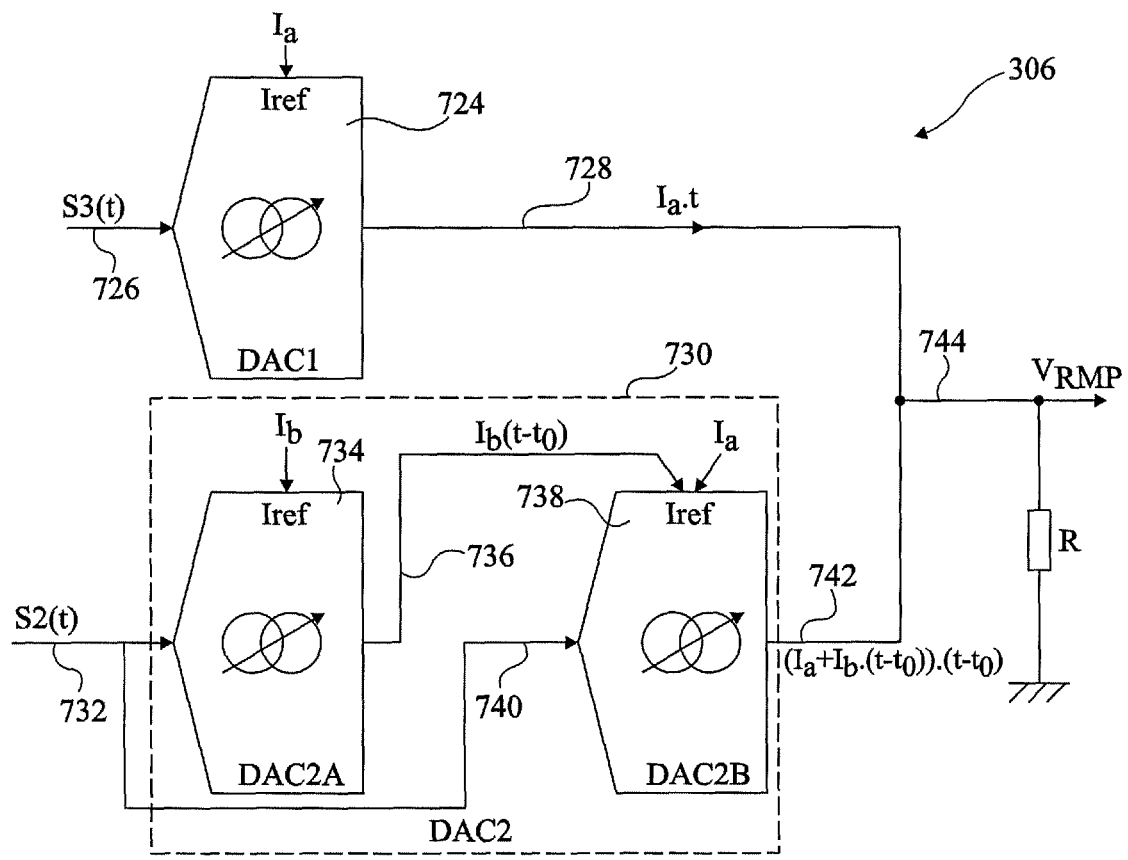

FIGS. 7A to 7C illustrate alternative examples of the ramp generator 306 of FIG. 3 for generating a ramp signal.

In the embodiment of FIG. 7A, a ramp signal of the form $b\cdot t^2$ is generated by a digital to analog converter (DAC) block 700, where b is a constant, and t is a time signal. A sequence of digital values $S1(t)$ representing the time signal t, for example generated by the N-bit output of a counter, is supplied to DACs 702 and 704 on an input line 706. The DAC 702 converts the sequence $S1(t)$ into an analog current signal, based on a reference current $I_b$, and in particular generates the signal $I_b\cdot t$ on an output line 708. DAC 704 converts the sequence $S1(t)$ into an analog current signal based on the time varying reference current $I_b\cdot t$, and in particular generates the signal $I_b\cdot t^2$. The output current is applied to a resistor R, such that the voltage across the resistor R provides the ramp signal $V_{RMP}$.

In some embodiments, the resistor R is variable, such that, for a given ramp, a scaling factor can be applied to increase or decrease its amplitude based on the level of the input signal, for example the level of light falling on an image sensor.

Figure 8:
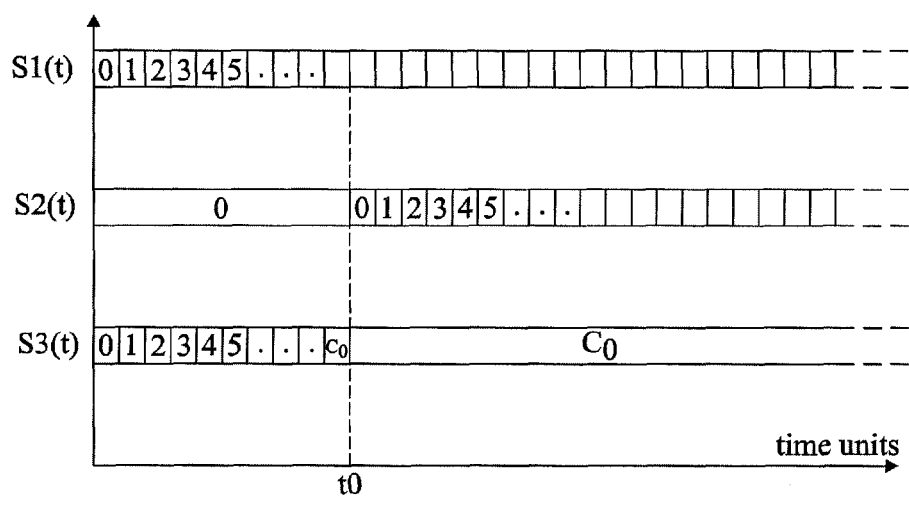
FIG. 8 is a timing diagram showing time signals used by the ramp generators of FIGS. 7A to 7C according to an embodiment.

FIG. 8 illustrates an example of the digital sequence $S1(t)$, the values of which start at an initial value 0 and periodically count upwards one value at a time, until the ramp signal reaches its maximum value.

The embodiment of FIG. 7B illustrates an alternative case in which the ramp signal $V_{RMP}$ is of the form $a\cdot t+b(t-t_0)^2$.

A DAC 712 receives the digital sequence $S1(t)$, which again is for example an N-bit count value from a counter, on an input line 714. DAC 712 converts this time signal into an analog current signal provided on an output line 716, based on a reference current $I_a$. In particular, DAC 712 generates the current signal $I_a\cdot t$.

Furthermore, a DAC block 700 is provided, identical to that of FIG. 7A, except that it receives a time signal in the form of a sequence $S2(t)$ of digital values on the input line 706.

As shown in FIG. 8, the sequence $S2(t)$ for example has a zero value until the time to, and then has values that count periodically from 0 upwards until the maximum value of the ramp signal is reached. Thus the sequence $S2(t)$ is equal to the sequence $S1(t)$ delayed by the time $t_0$.

Referring again to FIG. 7B, the output of DAC 702 on line 708 is thus equal to $I_b(t-t_0)$, and the output of DAC 704 on line 710 is therefore equal to $I_b(t-t_0)^2$.

The lines 716 and 710 from DACs 712 and 704 respectively are coupled together to form an output line 722, and the combined current, equal to $I_a\cdot t+I_b(t-t0)^2$, is applied to a resistor R to generate the ramp voltage signal $V_{RMP}$. Again, the resistance R could be variable.

In the embodiment of FIG. 7B, the curve 502 of FIG. 5 is generated by DAC 712, and the curve 504 of FIG. 5 is generated by DAC block 700. Alternatively, the implantation of FIG. 7C could be used to generate the same combined signal, by adding slightly different signals.

In FIG. 7C, a digital to analog converter (DAC) 724 generates the linear ramp between $t_i$ and $t_0$ of FIG. 5, and then a constant value equal to $V_i$. In particular, it receives on an input line 726 a digital time signal in the form of a sequence $S3(t)$ of digital values. As shown in FIG. 8, this signal has values that count upwards from 0 until the time $t_0$ is reached, and then the signal has a fixed value of $C_0$, where $C_0=T_0/Tck$, where Tck is the period between each value, and thus $C_0$ is the number periods Tck to reach to.

With reference again to FIG. 7C, DAC 724 generates an output current on an output line 728 initially equal to $I_a\cdot t$, where $I_a$ is a reference current, and then, after time $t_0$, equal to a constant value of $I_a\cdot t_0$, where $I_a\cdot t_0$ is for example equal to the voltage level $V_i$.

A DAC block 730 generates the quadratic portion of the ramp signal $V_{RMP}$. In particular, it comprises a DAC 734 that receives the digital time signal $S2(t)$ described above, on an input line 732. It converts this digital time signal into an analog current based on a reference current $I_b$, and thus outputs a current initially equal to zero and then equal to $I_b\cdot(t-t_0)$ on an output line 736. This current is provided as a reference current to a further DAC 738, which also receives the reference current $I_a$, and the digital time signal "0, then (t−t0)". DAC 738 generates the output current $(I_a+I_b\cdot(t-t0))\cdot(t-t0)$ on an output line 742. The output lines 728 and 742 of DACs 724 and 738 respectively are coupled together so that these currents are summed on a line 744, which is coupled to ground via a resistor R in order to generate the ramp voltage $V_{RMP}$. Again, the resistor R could be variable, as described above.

An advantage of the embodiment of FIG. 7C with respect to the embodiment of FIG. 7B is that, because of the current $I_a$ provided as a reference to DAC 738, all of the DACs always receive a non-zero reference current, whereas in the case of DAC 704 of FIG. 7B, the reference current is initially zero.

Figure 9:
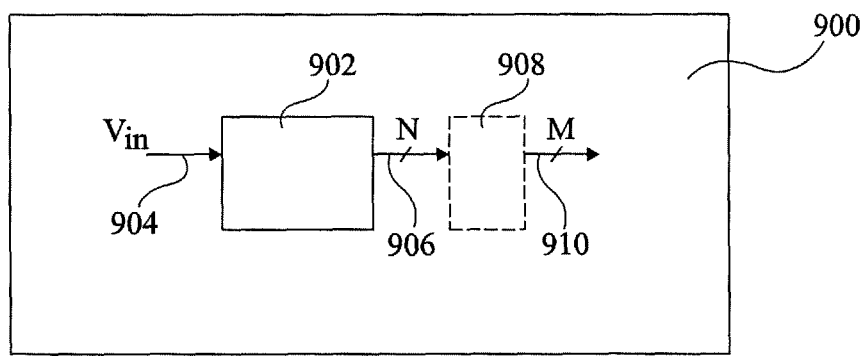
FIG. 9 illustrates an electronic device comprising an ADC according to an embodiment.

FIG. 9 illustrates an electronic device 900 comprising an ADC 902, which is for example the ADC 300 of FIG. 3A, which converts an analog input voltage Vin on an input line 904 into an N-bit digital output value on an output line 906. Optionally, adjustment circuitry 908 is provided, which is for example the circuitry 600 of FIG. 6 and linearizes the N-bit value to generate an M-bit value on an output line 910.

The electronic device 900 is for example an image sensor, or other device that converts an analog input signal into a digital output signal.

An advantage of embodiments of the present disclosure is that, by using a ramp signal generated based on a quadratic function, a high quality digital signal can be generated based on a relatively small counter. In particular, to generate an M-bit value, an N-bit counter can be used, where M is equal at least to N+1. This leads to a reduction in conversion time, as the voltage ramp may reach its maximum value in a shorter time period.

Furthermore, an advantage of generating the quadratic signal by converting a digital time signal into an analog signal based on time varying reference is that the implementation has low complexity. In particular, it may be implemented by a relatively small DAC of a number of bits around that of the counter 320, such as an 8 or 9-bit DAC.

A further advantage of embodiments described herein is that, by initially providing a linear curve of the ramp signal, the ramp may be well defined for low signal levels, and thus results in a high signal quality. In particular, this allows the initial LSB and thus the count value corresponding to a zero reading to be determined.

Having thus described at least one illustrative embodiment of the invention, various alterations, modifications and improvements will readily occur to those skilled in the art.

For example, it will be apparent to those skilled in the art that, while examples are provided in FIGS. 7A to 7C of the implementation of the ramp generator, alternative solutions would be possible.

Furthermore, it will be apparent to those skilled in the art that the current references $I_a$ and $I_b$ of FIGS. 7A to 7C may have a fixed level, or in some embodiments, these currents could be variable, such that for a given conversion, an amplitude of the ramp signal can be selected.

Furthermore, while the converter 300 provides one example of ramp converter, it will be apparent to those skilled in the art that the embodiments of the present disclosure could be applied to other ramp converter circuits, such as differential implementations.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method of analog to digital voltage conversion comprising:
generating a quadratic signal based on an analog time varying reference signal;
generating a ramp signal based on said quadratic signal, wherein generating said ramp signal further comprises generating a linear signal and summing said linear and quadratic signals to generate said ramp signal, and wherein said quadratic signal is offset by a reference time with respect to said linear signal such that said ramp signal comprises a linear portion up to said reference time; and
converting an analog input voltage to a digital output value based on a time duration determined by a comparison of said analog input voltage with said ramp signal.

2. The method of claim 1, wherein generating said quadratic signal comprises converting a digital time signal into said quadratic signal based on said analog time varying reference signal.

3. The method of claim 1, wherein said ramp signal comprises a linear portion followed by a portion equal to the sum of a linear signal and said quadratic signal.

4. The method of claim 1, wherein the derivative of said ramp signal is continuous.

5. The method of claim 1, wherein said analog input signal is the output of an image sensor, said method further comprising, prior to converting said analog input signal:
applying, during an initialization phase, a first voltage level of said ramp signal and a first reference value via respective capacitors to an input terminal of an amplifier, wherein said linear portion of said ramp signal starts at a voltage level lower than said first voltage level, and said reference time occurs when the voltage level of the ramp signal is equal to or higher than said first voltage level.

6. A method of analog to digital voltage conversion comprising:
generating a quadratic signal based on an analog time varying reference signal;
generating a ramp signal based on said quadratic signal, and
converting an analog input voltage to a digital output value based on a time duration determined by a comparison of said analog input voltage with said ramp signal, wherein said converting step comprises starting an N-bit counter at a start of said ramp signal, and storing the N-bit value of said counter when a voltage level of said ramp signal corresponds to the level of said analog input voltage, wherein said counter increments in a linear manner, the method further comprising linearizing said digital output value by converting it into an M-bit value, wherein M is equal to at least N+1.

7. The method of claim 1, further comprising linearizing said digital output value.

8. The method of claim 7, further comprising adding a random value to said M-bit value.

9. An analog to digital converter comprising:
a ramp generator adapted to generate:
a quadratic signal based on an analog time varying reference signal; and
a ramp signal based on said quadratic signal, wherein said ramp generator comprises a first digital to analog converter arranged to generate said quadratic signal by converting a digital time signal into said quadratic signal based on an analog time varying reference signal, wherein said quadratic signal and said analog time varying reference signal are currents, and wherein said ramp generator further comprises a second digital to analog converter arranged to convert said digital time signal into said time varying reference signal based on a reference current; and circuitry adapted to convert an analog input voltage to a digital output value based on a time duration determined by a comparison of said analog input voltage with said ramp signal.

10. The analog to digital converter of claim 9, wherein said ramp generator further comprises:

a third analog to digital converter arranged to convert said digital time signal into a second analog current; and at least one resistor receiving said first and second analog currents to generate said ramp signal.

11. An analog to digital converter comprising:

a ramp generator adapted to generate:

a quadratic signal based on an analog time varying reference signal; and a ramp signal based on said quadratic signal; and circuitry adapted to convert an analog input voltage to a digital output value based on a time duration determined by a comparison of said analog input voltage with said ramp signal, wherein said digital output value is an N-bit value, and further comprising adjustment circuitry adapted to convert said N-bit digital output value into an M-bit value based on a lookup table, wherein M is equal to at least N+1.

12. An image sensor comprising an array of pixel cells, each column of pixels cells being coupled to an analog to digital converter according to claim 9.

13. A method for analog to digital conversion, comprising:

generating a ramp signal that includes a quadratic signal and a linear signal, wherein generating the ramp signal comprises summing the quadratic signal and the linear signal;

converting an analog input voltage to an N-bit value, including comparing the analog input voltage to the ramp signal and controlling storage of the N-bit value based on the comparison; and converting the N-bit value to a linearized digital output value.

14. A method for analog to digital conversion as defined in claim 13, wherein the quadratic signal is started after a reference time with respect to the linear signal, such that the ramp signal is linear until the reference time has elapsed.

15. A method for analog to digital conversion as defined in claim 13, wherein the linearized digital output value has M-bits, where M is equal to at least N+1.

16. A method for analog to digital conversion as defined in claim 13, wherein converting the N-bit value to a linearized digital output value is based on a lookup table that provides the linearized digital output value in response to the N-bit value.

17. A method for analog to digital conversion as defined in claim 16, further comprising adding a random value to the linearized digital output value.

18. A method for analog to digital conversion as defined in claim 13, wherein generating the ramp signal comprises converting a digital time signal into the quadratic signal based on an analog time varying reference signal.

19. A method for analog to digital conversion as defined in claim 14, wherein converting the analog input voltage to the digital output value includes applying, during an initialization phase, a first voltage level of the ramp signal and a first reference value through respective capacitors to an input terminal of an amplifier, wherein a linear portion of the ramp signal starts at a voltage level lower than the first voltage level, and the reference time occurs when the voltage level of the ramp signal is equal to or greater than the first voltage level.

20. A method for analog to digital conversion as defined in claim 13, wherein comparing and controlling comprises starting a counter at a start of the ramp signal and storing the value of the counter as the N-bit value when a level of the ramp signal is equal to a level of the analog input voltage.

21. A method for analog to digital conversion as defined in claim 20, wherein the counter increments linearly.

22. An analog to digital converter comprising:

a ramp generator configured to generate a ramp signal that includes a quadratic signal and a linear signal, wherein the ramp generator is configured to start the quadratic signal after a reference time with respect to the linear signal, such that the ramp signal is linear until the reference time has elapsed;

a conversion circuit configured to convert an analog input voltage to an N-bit value, the conversion circuit including a comparison circuit configured to compare the analog input voltage to the ramp signal and to control storage of the N-bit value based on the comparison; and an adjustment circuit configured to convert the N-bit value to a linearized digital output value.

23. An analog to digital converter as defined in claim 22, wherein the linearized digital output value has M bits, where M is equal to at least N+1.

24. An analog to digital converter as defined in claim 22, wherein the adjustment circuit includes a lookup table that provides the linearized digital output value in response to the N-bit value.

25. An analog to digital converter as defined in claim 24, wherein the adjustment circuit is configured to add a random value to the linearized digital output value.

26. An analog to digital converter as defined in claim 22, wherein the ramp generator comprises a first digital to analog converter configured to generate the quadratic signal by converting a digital time signal into the quadratic signal based on an analog time varying reference signal, wherein the quadratic signal and the analog time varying reference signal are currents, and a second digital to analog converter configured to convert the digital time signal into the time varying reference signal based on a reference current.

27. An analog to digital converter as defined in claim 26, wherein the ramp generator further comprises a third analog to digital converter configured to convert the digital time signal into a second analog current, and at least one resistor configured to receive the first and second analog currents to generate the ramp signal.

* * * * *

UNITED STATES PATENT AND TRADEMARK OFFICE
CERTIFICATE OF CORRECTION

Page 1 of 1

PATENT NO.       : 8,659,465 B2
APPLICATION NO.  : 13/293969
DATED            : February 25, 2014
INVENTOR(S)      : Simony et al.

It is certified that error appears in the above-identified patent and that said Letters Patent is hereby corrected as shown below:

In the Specification:

Column 4, line 20 after "250" insert --$\mu V$--.

In the Claims:

Column 10, line 56, Claim 7 replace "1" with --6--.

Signed and Sealed this
Twenty-eighth Day of October, 2014

Michelle K. Lee
*Deputy Director of the United States Patent and Trademark Office*